United States Patent
Dudek et al.

[11] Patent Number: 5,972,565
[45] Date of Patent: *Oct. 26, 1999

[54] FLEXOGRAPHIC PRINTING FORMS HAVING RESISTANCE TO UV-HARDENABLE PRINTING INKS

[75] Inventors: Dietmar Dudek, Langen; Konrad Hinz; Bernd Struck, both of Dreieich, all of Germany

[73] Assignee: E. I. du Pont de Nemours and Company, Wilmington, Del.

[ * ] Notice: This patent is subject to a terminal disclaimer.

[21] Appl. No.: 08/931,057

[22] Filed: Sep. 16, 1997

[30] Foreign Application Priority Data

Sep. 27, 1996 [DE] Germany ............... 196 39 761

[51] Int. Cl.$^6$ ............... G03F 7/033; G03F 7/028
[52] U.S. Cl. ............... 430/287.1; 430/286.1; 430/273.1
[58] Field of Search ............... 430/286.1, 287.1, 430/273.1

[56] References Cited

U.S. PATENT DOCUMENTS

| | | | |
|---|---|---|---|
| 3,333,024 | 7/1967 | Haefele et al. | 525/314 |
| 3,431,323 | 3/1969 | Jones | 525/258 |
| 4,126,466 | 11/1978 | Roos | 96/84 UV |
| 4,162,919 | 7/1979 | Richter et al. | 96/87 |
| 4,266,005 | 5/1981 | Nakamura et al. | 430/271 |
| 4,320,188 | 3/1982 | Heinz et al. | 430/281 |
| 4,323,636 | 4/1982 | Chen | 430/271 |
| 4,430,417 | 2/1984 | Heinz et al. | 430/286 |
| 4,460,675 | 7/1984 | Gruetzmacher et al. | 430/300 |
| 4,622,088 | 11/1986 | Min | 156/244.11 |
| 4,719,261 | 1/1988 | Bunnelle et al. | 525/97 |
| 4,913,991 | 4/1990 | Chiba et al. | 430/45 |
| 5,112,725 | 5/1992 | Kurtz et al. | 430/306 |
| 5,239,009 | 8/1993 | Halasa et al. | 525/258 |
| 5,281,510 | 1/1994 | Sakural et al. | 430/283 |
| 5,472,824 | 12/1995 | Schober et al. | 430/309 |

FOREIGN PATENT DOCUMENTS

| | | | |
|---|---|---|---|
| 0 362 850 A2 | 4/1990 | European Pat. Off. | C08L 53/02 |
| 0 437 068 A2 | 12/1990 | European Pat. Off. | C09J 7/02 |
| 0 438 967 A1 | 12/1990 | European Pat. Off. | C08F 297/04 |
| 0 525 206 a1 | 2/1993 | European Pat. Off. | G03F 7/038 |
| 0 653 464 A2 | 11/1994 | European Pat. Off. | C08L 101/00 |
| 0 696 761 A1 | 2/1996 | European Pat. Off. | G03F 7/038 |
| 03287652 | 12/1991 | Japan | C08L 53/02 |
| 06293853 | 10/1994 | Japan | C08L 53/02 |
| 002089165 | 11/1994 | WIPO . | |

*Primary Examiner*—Janet Baxter
*Assistant Examiner*—Sin J. Lee
*Attorney, Agent, or Firm*—Thomas H. Magee

[57] ABSTRACT

A photopolymerizable mixture for photopolymerizable printing plates with an improved resistance to UV-hardenable printing inks, contains 10–45% by weight of at least one thermoplastic, elastomeric, block copolymer comprising of two or more polymer blocks comprising aromatic vinyl units and one or more polymer blocks comprising isoprene and/or isoprene/butadiene units. The block copolymer has a vinyl bond content not above 70%, a glass transition temperature not above 20° C., and a peak temperature of a primary dispersion of tan δ not above 30° C.

9 Claims, No Drawings

5,972,565

FLEXOGRAPHIC PRINTING FORMS HAVING RESISTANCE TO UV-HARDENABLE PRINTING INKS

BACKGROUND OF THE INVENTION

1. Field of the Invention

The invention involves a photopolymerizable mixture containing elastomeric binder, photopolymerizable, ethylenically unsaturated compounds, and photoinitiators; a photopolymerizable printing plate comprising at least one photopolymerizable layer of such a mixture; and a flexographic printing form made from the plate.

2. Description of Related Art

Photopolymerizable printing plates are known for use in making flexographic printing forms. The printing surface is produced by imagewise exposure of a photopolymerizable layer to actinic radiation and subsequent removal of the unexposed, unphotopolymerized areas of the printing plate. Examples are found in the following patents: DE-C 22 15 090, U.S. Pat. No. 4,266,005, U.S. Pat. No. 4,320,188, U.S. Pat. No. 4,126,466 and U.S. Pat. No. 4,430,417. Such photopolymerizable printing plates usually comprise a support, an optional adhesive or other underlayer, one or more photopolymerizable layers, an optional, elastomeric, intermediate layer, and a cover layer.

A preferred method for making such multilayer photopolymerizable printing plates is a process in which a previously extruded photopolymerizable composition is fed into the nip of a calender and is calendered between a support and a cover element, thus forming a photopolymerizable layer between them. EP-B 0 084 851 discloses a preparation method for a multilayer photopolymerizable printing plate having an added elastomeric layer between the flexible, tear-resistant polymer layer and the photopolymerizable layer.

The photopolymerizable layers contain polymeric binders, photopolymerizable monomers, photoinitiators, and added auxiliaries, such as plasticizers, fillers, stabilizers, etc. The polymeric binders are usually thermoplastic, elastomeric, block copolymers, as described, for example, in DE-C 22 15 090. These are generally A-B-A block copolymers having thermoplastic blocks A and elastomeric blocks B, particularly linear and radial block copolymers with polystyrene end blocks, such as, for example, polystyrene/polyisoprene/polystyrene, (polystyrene/polyisoprene)$_4$Si, or the corresponding butadiene polymers. The use of polymers having a certain vinyl content is also known for special purposes, such as, for example, for improving printing plate properties with special monomers (EP 0 525 206) or for preparing printing plates without monomer addition. Similar block copolymers and their use in highway engineering and automobile manufacture are described in EP-B 0 362 850. However, polystyrene/polybutadiene/polystyrene and polystyrene/polyisoprene/polystyrene block copolymers are preferred for making flexographic printing forms.

Nevertheless, current state-of-the-art printing forms frequently do not meet requirements for flexographic printing. In particular, when UV-hardenable inks are used, the printing forms are not sufficiently resistant to ink constituents diffusing into the forms. This increases layer thickness, changes image geometry on the printing form surface, and decreases Shore A hardness during printing. This is seen in the printed image as undesired spreading in positive image elements or as fine negative image elements running together.

Therefore, the present invention is based on the problem of making available flexographic printing forms that have improved resistance to UV-hardenable printing inks and that do not have the disadvantages described for printing forms of the current state of the art. In addition, the photopolymerizable printing plates for making these flexographic printing forms should have wide exposure latitude without adversely affecting other essential properties of the photopolymerizable printing plates or flexographic printing forms.

SUMMARY

This problem was solved surprisingly by a photopolymerizable mixture for a photopolymerizable printing plate containing at least one elastomeric binder, at least one photopolymerizable, ethylenically unsaturated compound, and at least one photoinitiator or photoinitiator system. The mixture contains 10–45% by weight of at least one thermoplastic, elastomeric, block copolymer comprising two or more polymer blocks synthesized from aromatic monomers and one or more polymer blocks synthesized from isoprene and/or isoprene/butadiene units. The block copolymer has a vinyl bond content not above 70%, a glass transition temperature not above 20° C., and a peak temperature of a primary dispersion of tan δ not above 30° C. A flexographic printing form is made from the photopolymerizable printing plate containing the mixture.

DESCRIPTION OF THE PREFERRED EMBODIMENT(S)

A photopolymerizable mixture for a photopolymerizable printing plate contains at least one elastomeric binder, at least one photopolymerizable, ethylenically unsaturated compound, and at least one photoinitiator or photoinitiator system. The mixture contains 10–45% by weight of at least one thermoplastic, elastomeric, block copolymer comprising two or more polymer blocks synthesized from aromatic monomers and one or more polymer blocks synthesized from isoprene and/or isoprene/butadiene units. The block copolymer has a vinyl bond content not above 70%, a glass transition temperature not above 20° C., and a peak temperature of a primary dispersion of tan δ not above 30° C. Surprisingly, the use of polymers of the present invention increased substantially the resistance of flexographic printing forms to UV-hardenable printing inks. In addition, the exposure latitude of the photopolymerizable printing plates was clearly increased, which is very important because of the special motive selection in printing with UV printing inks. Furthermore, printing forms prepared from the photopolymerizable mixture of the invention show good ink transfer and stable Shore A hardness.

Block copolymers of the invention are thermoplastic, elastomeric, block copolymers that contain two or more blocks synthesized from aromatic monomers and one or more blocks synthesized from isoprene or isoprene/butadiene units. Polystyrene blocks and polyisoprene blocks are preferred. Polystyrene/polyisoprene/polystyrene triple-block copolymers are particularly preferred.

The vinyl bond content of the block copolymers of the invention is not above 70%, is preferably 30–60%, and is measured by NMR (Nuclear Magnetic Resonance) spectra, as described in EP-B 0362 850. The glass transition temperature of the polymers of the invention is not above 20° C., and is preferably −20 to +10° C. The peak temperature of a primary dispersion of tan δ is not above 30° C., and is preferably −10 to +25° C. which is determined from viscoelastic measurements, with a Rheovibron® instrument from Orientec Corp. The aforementioned viscoelastic measurement is the same as or similar to that in EP-B 0362 850. The polystyrene content of the polymers of the invention is 10–30% by weight, preferably 15–25% by weight. The average molecular weight $M_n$ of these polymers is 30,000–280,000, preferably 60,000–220,000. The average molecular weight $M_n$ of an aromatic block is 3,000–40,000, and that of an elastomeric block containing vinyl groups is 10,000–200,000.

Polymers of this invention are used preferably as mixtures with other thermoplastic, elastomeric, block copolymers containing ≦20% vinyl bonds. In this case, the quantity of the polymers of the invention is not less than 20% by weight and not more than 55% by weight, preferably 50% by weight, relative to the total quantity of polymeric binder.

Other particularly suitable block copolymers are described in DE-C 22 15 090; U.S. Pat. No. 4,320,188; U.S. Pat. No. 4,197,130, U.S. Pat. No. 4,430,417, or U.S. Pat. No. 4,162,919. Particularly suitable as binders are linear and radial block copolymers having polystyrene end blocks, such as, for example, polystyrene/polyisoprene/polystyrene, (polystyrene/polyisoprene)$_4$Si, or the corresponding butadiene polymers, insofar as they are compatible with the binders of the invention. Polymers containing polyisoprene are particularly suitable. The average molecular weight $M_n$ of the block copolymers is usually between 80,000 and 300,000, preferably between 100,000 and 250,000. A polystyrene proportion of 10–40% by weight is advantageous, especially a content of 15–30% by weight.

Polymers of the invention can be used in one or more photopolymerizable layers of the printing plate. A special advantage is that no additional printing layers are required. The preparation of such photopolymerizable printing plates is thus simple and economical.

Ethylenically unsaturated compounds in the photopolymerizable layer can be known monounsaturated or polyunsaturated monomers, such as, for example, esters or amides of acrylic acid or methacrylic acid with monofunctional or polyfunctional alcohols, amines, aminoalcohols, hydroxyethers, and hydroxyesters. Also suitable are mixtures of monounsaturated and polyunsaturated compounds, as described in DE-CL 37 44 243 and DE-A 36 30 474. Examples of addition-polymerizable compounds are butyl acrylate, isodecyl acrylate, tetradecyl acrylate, 2-hexyloxyethyl acrylate, 1,4-butanediol diacrylate, 1,6-hexanediol dimethacrylate, 1,6-hexanediol diacrylate, trimethylolpropane triacrylate, and dipentaerythritol monohydroxypentacrylate.

The photopolymerizable layer also contains one of the known photoinitiators or a photoinitiator system, for example, methyl benzoin, benzoin acetate, benzophenone, benzil dimethylketal, ethyl anthraquinone/4,4'-bis (dimethylamino)benzophenone.

The photopolymerizable layer generally contains 60–80% by weight of binder or binder mixture, 5–30% by weight of monomer or monomer mixture, and 0.5–5% by weight of initiator. The quantity of the block copolymers of the invention is 10–45 % by weight, preferably 20–45% by weight. At higher contents of the polymers of the invention, the resilience of the printing forms is too low, and other printing plate properties, such as cohesion in the composite of multilayer plates and adhesion to the support are adversely affected. Other auxiliaries, such as for example, fillers, dyes, antioxidants, antiozonants, thermal polymerization inhibitors, and plasticizers can be used in customary quantities.

Suitable supports for the photopolymerizable printing plates of the invention are, for example, sheets of various film-forming synthetic polymers. Polyester and polyester/polyamide sheets, optionally having an adhesive layer and/or an antihalation layer, are preferred, particularly polyethylene terephthalate sheets.

The cover layer can be the usual sheet for this purpose, for example, polystyrene, polyethylene, polypropylene, or polyethylene terephthalate. An optional, thin, nonadhesive, flexible polymer layer which can be removed by the developer solvent is located under the cover layer. Polyamides, ethylene/vinyl acetate copolymers, or similar polymers that form transparent and tear-resistant films are preferred. The layer thickness is 0.0025–0.038 mm.

The preferred process for preparing the photopolymerizable printing plate is by extruding and then calendering the photopolymerizable composition between the support and a cover element. This process is described in EP-B1 084 851. The cover element can comprise only a cover layer or additionally an elastomeric layer and/or a flexible polymer layer as previously described.

The photopolymerizable printing plate is exposed imagewise through a negative by commonly used methods. The cover layer of the photopolymerizable printing plate is removed as usual before imagewise exposure. Any type and source of actinic radiation can be used to prepare the flexographic printing forms. Suitable radiation sources are, for example, mercury vapor lamps, incandescent lamps with special phosphors that emit ultraviolet light, argon incandescent lamps, and photo lamps. The most suitable among these are mercury vapor lamps, particularly ultraviolet light lamps, and ultraviolet fluorescent lamps.

An overall backside exposure can be made before or after imagewise exposure. This exposure can be diffuse or directional. The exposure source can be all of the radiation sources used for the imagewise exposure.

Unphotopolymerized areas of the printing plate can be washed off with suitable developer solutions, such as, for example, aliphatic or aromatic hydrocarbons, such as n-hexane, petroleum ether, hydrogenated petroleum fractions, limonene or other terpenes, toluene, isopropyl benzene, ketones, such as, for example, methylethyl ketone, halogenated hydrocarbons, such as chloroform, trichloroethane, or tetrachloroethylene, esters, such as, for example, acetic acid esters, acetoacetic acid esters, or mixtures of these solvents. Additives, such as surfactants or alcohols are possible constituents. After being dried, the resulting printing form can be postexposed or post-treated chemically in any sequence to make a nontacky printing surface.

EXAMPLES

The following examples are intended to explain the present invention. Parts and percentages, unless otherwise stated, are by weight. The average molecular weights of the polymers are specified as number average, $M_n$.

Example 1

A charge of, in each instance, 80% by weight of various binder mixtures of a block copolymer according to the invention, a polystyrene/polyisoprene/polystryene tri block co-polymer sold under the tradename VS-3 (from Kuraray Company, Japan), (vinyl bond content 37%, glass transition temperature −17° C., peak temperature of tan δ −3° C., polystyrene content 20%), and a styrene/isoprene/styrene linear block copolymer, sold under the trademark CARIFLEX 1107 (from Shell Company), with, in each instance, 8% by weight of hexamethyleneglycol diacrylate, 1.8% by weight of hexamethylene-glycol dimethacrylate, 6% by weight of a 1,2 polybutadiene resin sold under the trademark NISSO-PB B-1000, 3% by weight of Irgacure a photoinitiator sold under the trademark IRGACURE 651, 1% by weight of 2,6-di-tert-butyl-4-methylphenol, and 0.2% by weight of a commercial dye were kneaded at ca. 145° C. in a laboratory kneader (Werner & Pfleiderer Type LUK 025). After the melts were cooled, the mixtures were pressed in a laboratory press (140° C., 23 bar) into plates 2 mm thick between two polyester sheets. These plates were then processed in the usual manner for photopolymer flexographic printing plates (that is, exposed, washed off, and postexposed). Pieces of 3×3 cm were cut out from the solids, and their weight, layer thickness, and Shore A hardness were measured. The samples were overcoated with UV ink (magenta from Hartmann Company), cleaned, and measured again. The percentage weight increase, layer thickness increase, and Shore A hardness decrease are shown in Table 1. The exposure latitude of the different plate mixtures is also shown. These quantities are determined by measuring first the exposure time required for all dots in the 2% dot field on the 48 l/cm screen to hold reliably. Then the exposure time is measured at which the depth of a negative line 0.8 mm wide becomes less than 0.1 mm. The difference between the two exposure times is shown as exposure latitude.

TABLE 1

|    | Binder VS-3% | Ratio 1107% | Weight Increase % | Thickness Increase μ | Hardness Loss Shore A | Exposure Latitude min |
|----|------|------|------|----|---|-----|
| A) | 0    | 100  | 2.60 | 59 | 5 | 4   |
| B) | 21.5 | 78.5 | 2.31 | 60 | 4 | >7  |
| C) | 34.6 | 65.4 | 1.93 | 33 | 3 | >10 |
| D) | 50   | 50   | 1.68 | 20 | 4 | >7  |
| E) | 54   | 46   | 1.28 | 15 | 3 | >13 |

Example 2

Printing plates were prepared and processed as described in Example 1. The binder according to the invention was a a polystyrene/polyisoprene/polystryene tri block co-polymer sold under the tradname VS-1 (from Kuraray Company, Japan), having a vinyl bond content of 60%, a glass transition temperature of 8° C., a peak temperature of tan δ of 20° C., a polystyrene content of 21%.

TABLE 2

|    | Binder VS-1% | Ratio 1107% | Weight Increase % | Thickness Increase μ | Hardness Loss Shore A | Exposure Latitude min |
|----|----|----|------|----|-----|----|
| A) | 25 | 75 | 2.37 | 16 | 4.4 | >7 |
| B) | 50 | 50 | 1.62 | 16 | 3.0 | >7 |

What is claimed is:

1. A photopolymerizable mixture containing
   a) at least one elastomeric binder,
   b) at least one photopolymerizable, ethylenically unsaturated compound, and
   c) at least one photoinitiator or photoinitiator system, characterized in that the mixture contains 10–45% by weight based on the total weight of the mixture of at least one thermoplastic, elastomeric, block copolymer comprising two or more polymer blocks comprising aromatic vinyl units and one or more polymer blocks comprising isoprene and/or isoprene/butadiene units, said block copolymer having a vinyl bond content between 30 to 60% by weight, a glass transition temperature not above 20° C., and a peak temperature of a primary dispersion of tan δ not above 30° C.

2. The photopolymerizable mixture according to claim 1, characterized in that the vinyl bond content of the thermoplastic, elastomeric, block copolymer is not above 40% by weight.

3. The photopolymerizable mixture according to claim 1, characterized in that the thermoplastic, elastomeric, block copolymer is a polystyrene/polyisoprene/polystyrene triple-block copolymer.

4. The photopolymerizable mixture according to claim 3, characterized in that the polystyrene content of the thermoplastic, elastomeric, block copolymer is 10–30% by weight.

5. The photopolymerizable mixture according to claim 1, characterized in that the glass transition temperature of the thermoplastic, elastomeric, block copolymer is not above 0° C.

6. The photopolymerizable mixture according to claim 1, characterized in that a polystyrene/polyisoprene/polystyrene block copolymer having a vinyl bond content ≦20% by weight is used as an additional binder.

7. The photopolymerizable mixture according to claim 1, characterized in that the quantity of thermoplastic, elastomeric, block copolymer is 20–55% by weight, relative to the total weight of the elastomeric binder.

8. A photopolymerizable printing plate comprising a support; at least one photopolymerizable layer; and a cover element; characterized in that the photopolymerizable layer comprises a photopolymerizable mixture according to claim 1.

9. The photopolymerizable printing plate according to claim 8, characterized by the presence of an additional polymeric protective layer between the photopolymerizable layer and the cover element.

* * * * *